United States Patent
Takemura

(10) Patent No.: US 9,851,198 B2
(45) Date of Patent: Dec. 26, 2017

(54) DISTANCE MEASURING APPARATUS, DISTANCE MEASURING METHOD, AND CONTROL PROGRAM

(71) Applicant: Kabushiki Kaisha Toshiba, Minato-ku, Tokyo (JP)

(72) Inventor: Shota Takemura, Fuchu (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 695 days.

(21) Appl. No.: 14/365,087

(22) PCT Filed: Jan. 28, 2013

(86) PCT No.: PCT/JP2013/051769
§ 371 (c)(1),
(2) Date: Jun. 12, 2014

(87) PCT Pub. No.: WO2013/115134
PCT Pub. Date: Aug. 8, 2013

(65) Prior Publication Data
US 2015/0025843 A1    Jan. 22, 2015

(30) Foreign Application Priority Data
Feb. 2, 2012 (JP) ................................. 2012-021291

(51) Int. Cl.
*G01B 11/14* (2006.01)
*H01L 27/148* (2006.01)
(Continued)

(52) U.S. Cl.
CPC ............ *G01B 11/14* (2013.01); *G01B 11/026* (2013.01); *G01B 11/2518* (2013.01); *G01S 17/48* (2013.01); *H01L 27/14868* (2013.01)

(58) Field of Classification Search
CPC ... G01B 11/14; G01B 11/026; G01B 11/2518; G01S 17/48; H01L 27/14868
See application file for complete search history.

(56) References Cited

U.S. PATENT DOCUMENTS

| | | | |
|---|---|---|---|
| 7,773,277 B2 | 8/2010 | Yamaguchi et al. | |
| 2010/0073750 A1* | 3/2010 | Yamaguchi | G01S 7/4811 359/200.7 |
| 2011/0298896 A1 | 12/2011 | Dillon et al. | |

FOREIGN PATENT DOCUMENTS

| | | |
|---|---|---|
| CN | 1455883 A | 11/2003 |
| CN | 102326169 A | 1/2012 |

(Continued)

OTHER PUBLICATIONS

Office Action mailed by the Taiwanese Patent Office dated Jul. 11, 2014 in the corresponding Taiwanese patent application No. 102103961—8 pages.

(Continued)

*Primary Examiner* — Manuel L Barbee
(74) *Attorney, Agent, or Firm* — Knobbe Martens Olson & Bear LLP

(57) ABSTRACT

According to an embodiment, a distance measuring apparatus includes a multi laser beam emitting unit, an irradiating position changing unit, an image acquiring unit, and a distance calculating unit. The multi laser beam emitting unit irradiates a surface of a measurement target object with a plurality of elliptical laser beams provided in line in a minor axis direction. The irradiating position changing unit reciprocally moves irradiating positions of the laser beams all together along a major axis of the laser beams. The image acquiring unit receives reflected lights of the laser beams, and acquires an image of a bright and dark pattern of the reflected lights of the laser beams formed on an image acquiring face. The distance calculating unit calculates a (Continued)

distance to the measurement target object based on the bright and dark pattern of the reflected lights on the image acquiring face.

6 Claims, 4 Drawing Sheets

(51) Int. Cl.
*G01S 17/48* (2006.01)
*G01B 11/02* (2006.01)
*G01B 11/25* (2006.01)

(56) References Cited

FOREIGN PATENT DOCUMENTS

| | | | |
|---|---|---|---|
| JP | 02-148408 U | | 12/1990 |
| JP | 05-141965 A | | 6/1993 |
| JP | 08-304068 A | | 11/1996 |
| JP | 2000-147604 A | | 5/2000 |
| JP | 2004-163343 A | | 6/2004 |
| JP | 2004163343 A | * | 6/2004 |
| JP | 2008-224408 A | | 9/2008 |
| JP | 2012-518791 A | | 8/2012 |
| WO | WO 02/37163 A1 | | 5/2002 |
| WO | WO 2010/096634 A1 | | 8/2010 |

OTHER PUBLICATIONS

Chinese Office Action Dated May 12, 2016 of Chinese Patent Application No. 201380004457.3—7 pages.
International Search Report issued by Japan Patent Office dated Apr. 2, 2013 in the corresponding PCT Application No. PCT/JP2013/051769—5 pages.

* cited by examiner

DISTANCE MEASURING APPARATUS, DISTANCE MEASURING METHOD, AND CONTROL PROGRAM

CROSS-REFERENCE TO RELATED APPLICATIONS

This application is national stage application of International Application No. PCT/JP2013/051769, filed Jan. 28, 2013, which designates the United States, incorporated herein by reference, and which claims the benefit of priority from Japanese Patent Application No. 2012-021291, filed Feb. 2, 2012, the entire contents of which are incorporated herein by reference.

FIELD

Embodiments described herein relate generally to a distance measuring apparatus, a distance measuring method, and a control program.

BACKGROUND

Conventionally, an optical triangulation method is used to measure a surface shape of a measurement target object since the method allows high accuracy contactless distance measurement.

Further, recently, the optical triangulation method is widely adopted in measurement of a thickness or shape of a measurement target object such as steel plate, which is conveyed at high speed.

However, according to the conventional triangulation method, sometimes the intensity or the position of the reflected light cannot be determined accurately due to change in surface reflectance, scattering property, or the like, because the triangulation method is an optical method.

Thus, high accuracy measurement has been performed in the following manner. In particular, interference is caused from an irradiating laser by a slit to form a multi laser beam, and a bright and dark pattern of fringes is detected. Then, a shape of a brightness curve at a dark part of the bright and dark pattern and at a darker part between bright parts (shape of the well portion) is approximated by a function. Subsequently, the minimum coordinate at the dark part calculated. Consequently, a distance is calculated. Such measurement is less affected by a reflectance or a scattering property of the measurement target.

However, in order to perform high accuracy measurement by a method for detecting darker parts (well portions), the shape of the well portion needs to be capable of being approximated by a function.

The reason the shape of the well portion is disordered is because of an influence of speckle noise due to a tiny irregularity on a surface of the measurement target object.

DETAILED DESCRIPTION

According to an embodiment, a distance measuring apparatus includes a multi laser beam emitting unit, an irradiating position changing unit, an image acquiring unit, and a distance calculating unit. The multi laser beam emitting unit irradiates a surface of a measurement target object with a plurality of elliptical laser beams provided in line in a minor axis direction. The irradiating position changing unit reciprocally moves irradiating positions of the laser beams all together along a major axis of the laser beams. The image acquiring unit receives reflected lights of the laser beams, and acquires an image of a bright and dark pattern of the reflected lights of the laser beams formed on an image acquiring face. The distance calculating unit calculates a distance to the measurement target object based on the bright and dart pattern of the reflected lights on the image acquiring face.

Next, embodiments are explained in details with reference to the drawings.

[1] First Embodiment

Figure 1:
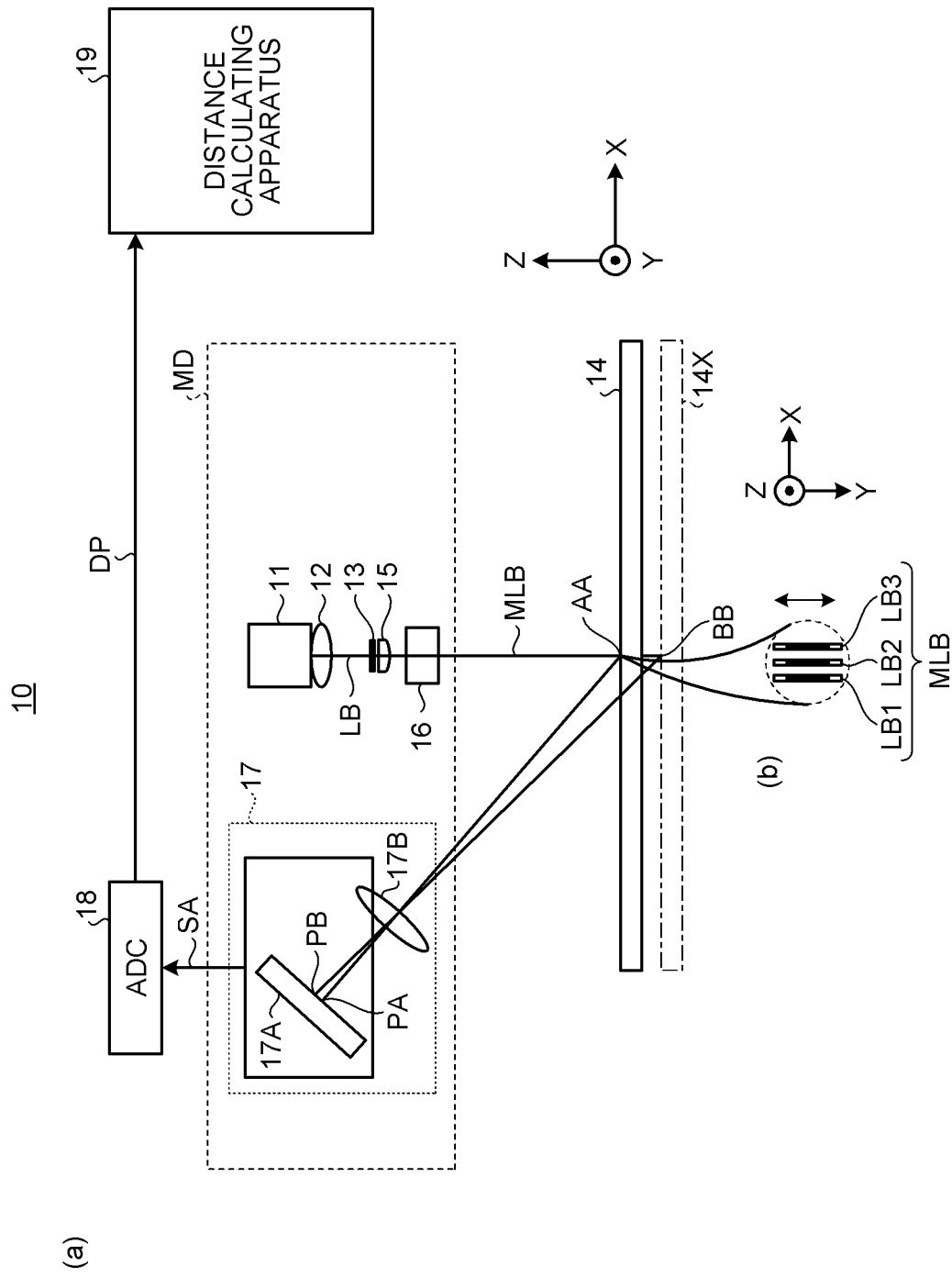
FIG. 1 is a diagram for explaining a general configuration of a distance measuring apparatus and a state of irradiation with a multi laser beam, according to a first embodiment.

FIG. 1 is a diagram for explaining a general configuration of a distance measuring apparatus and a state of irradiation with a multi laser beam, according to a first embodiment.

As illustrated in (a) of FIG. 1, a distance measuring apparatus 10 includes a light source 11, a collimate lens 12, and a slit 13. The light source 11 emits a laser beam LB. The collimate lens 12 forms a parallel light from the laser beam LB. The slit 13 splits the laser beam LB formed as the parallel light to a multi laser beam MLB configured by a plurality of elliptical laser beams LB1 to LB3.

Further, the distance measuring apparatus 10 includes a cylindrical lens 15 and an optical system unit 16. The cylindrical lens 15 forms an image on the measurement target object 14 from the multi-laser beam MLB. The optical system unit 16 reciprocally moves (oscillates) a position on a surface of the measurement target object 14 irradiated with the multi-laser beam MLB, in order to reduce noise.

Furthermore, the distance measuring apparatus 10 includes a CCD camera 17 that functions as an image acquiring unit and outputs an acquired image signal SA (analog signal). The CCD camera 17 includes a CCD 17A and a light receiving lens 17B. The light receiving lens 17B forms an image on an image acquiring face of the CCD 17A from the multi-laser beam MLB reflected at the measurement target object 14.

Still further, the distance measuring apparatus 10 includes an A/D converter (ADC) 18 and a distance calculating apparatus 19. The A/D converter performs A/D conversion on the acquired image signal SA output from the CCD camera 17, and outputs an acquired image data DP. The distance calculating apparatus 19 calculates a distance to the measurement target object 14 based on the input acquired image data DP.

In the above configuration, the light source 11, the collimate lens 12, and the slit 13 function as a multi laser beam emitting unit.

Then, as illustrated in (b) of FIG. 1, the light source 11, the collimate lens 12, and the slit 13 irradiates a surface of the measurement target object 14, which is a target object to be measured, with the elliptical laser beams LB1 to LB 3 provided in line in a minor axis direction (X-axis direction in FIG. 1).

The optical system unit 16 functions as an irradiating position changing unit. Further, the optical system unit 16 functions as a multi laser beam emitting unit, and irradiates the surface of the measurement target object with the plurality of elliptical laser beams provided in line in the minor axis direction. The irradiating position changing unit reciprocally moves the irradiating positions of the laser beams all together along a major axis direction of the irradiating laser beams.

Then, the CCD camera 17 functions as an image acquiring unit. The CCD camera 17 receives reflection lights of the laser beams LB1 to LB3. Then, the CCD camera 17 acquires an image of a bright and dark pattern of the reflection lights (fringes of the reflection lights) formed on the image acquiring surface.

As a result, the distance calculating apparatus 19 functions as a distance calculating unit. That is to say, the distance calculating apparatus 19 obtains, by calculation, a distance to the measurement target object 14 based on the bright and dark pattern of the reflection light of the laser beams LB1 to LB3 on the image acquiring face.

In the above-mentioned configuration, the light source 11, the collimate lens 12, the slit 13, the cylindrical lens 15, the optical system unit 16, the CCD 17A, and the receiving lens 17B constitute a distance detecting unit MD.

The optical system of the distance detecting unit MD is set and arranged at a predetermined distance away from the measurement target object 14. Then, the CCD camera 17 forms an image of the surface of the measurement target object 14 at the point AA on the image acquiring surface of the CCD 17A at the point PA.

In this case, if the surface (measurement face) of the measurement target object 14 moves (changes) from Point AA to Point BB, the point of image formation of the laser beams LB1 to LB3 constituting the multi-laser beam MLB each moves from Point PA to Point PB. Number of pixels (number of elements) of the CCD 17A is selected so that a predetermined resolution is obtained with respect to the range of movement, i.e., the range of distance measurement.

Further, the CCD 17A is configured as a line scanning CCD. Consequently, the collimator magnification of the collimate lens 12 is set so that, in the CCD 17A, the shape of the laser beams LB1 to LB3 on the surface of the measurement target object 14 becomes larger than a measurement visual field size of the CCD 17A.

Further, the receiving lens 17B is selected in a manner such that an optical magnification of the receiving lens 17B is determined based on a distance to the measurement target object 14 and a resolution of the CCD 17A.

For example, the CCD 17A has number of pixels (number of elements) of 1000 pixels to 5000 pixels, and a shape of each of the pixels (elements) is approximately 15 μm×15 μm. Then, the resolution on the surface of the measurement target object 14 is determined based on the magnification of the optical system such as the receiving lens 17. For example, if the magnification of the optical system is set as 1/10, the resolution on the surface of the measurement target object 14 is 150 μm.

Figure 2:
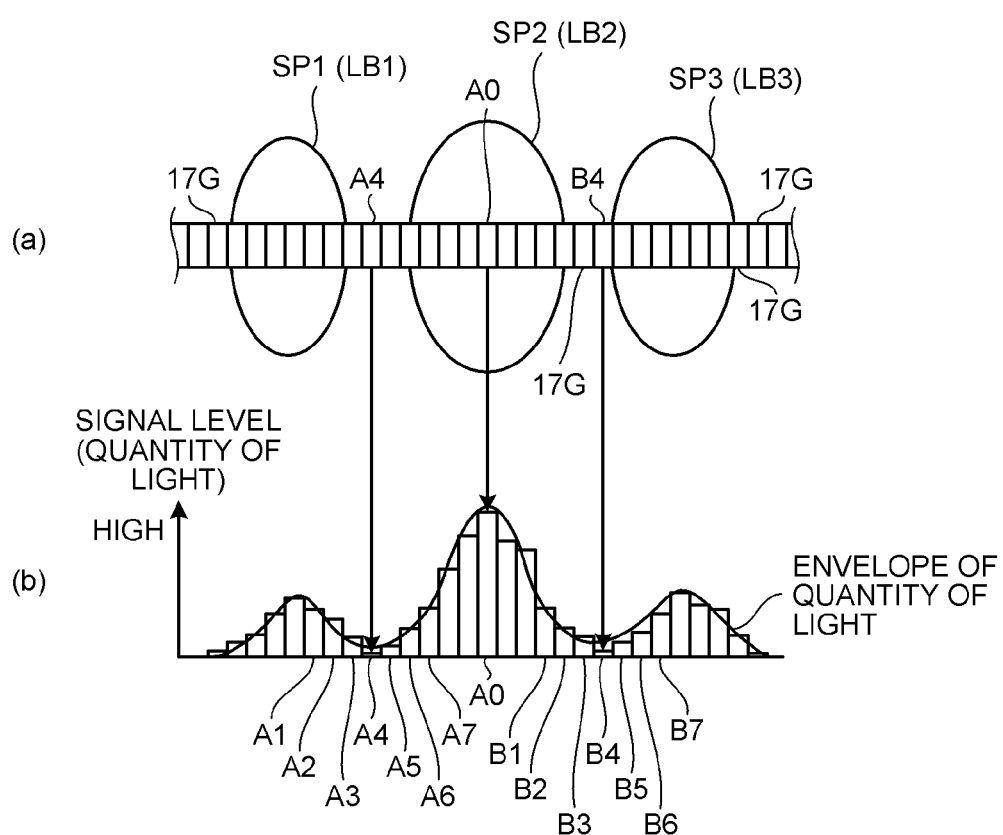
FIG. 2 is a diagram for explaining a relationship between the multi laser beam and an output signal level of a CCD.

FIG. 2 is a diagram for explaining a relationship between the multi laser beam and the output signal level of the CCD.

In (a) of FIG. 2, the reference numerals SP1 to SP3 are images formed on the light receiving face of the CCD 17A by the laser beams LB1 to LB3 constituting the multi-laser beam MLB.

(b) of FIG. 2 illustrates an output signal level (quantity of light is higher if the output signal level is higher) of each of the elements of when the laser beams LB1 to LB3 are scanned by the CCD 17A.

Normally, shapes of the laser berms LB1 to LB 3 are formed elliptically by the collimate lens 12 and the slit 13 of the distance detecting unit MID.

Further, the line of rectangles illustrated in (a) of FIG. 2 illustrates each of light receiving elements 17G of the CCD 17A constituting the line scan CCD. Here, the direction of the line of the light receiving elements 17G is in the X-axis direction of FIG. 1, and the long axis direction of the rectangles is in the Y-axis direction of FIG. 1. Then, an optical axis of the CCD camera 17 is set so that the CCD camera 17 scans the center in the long axis direction of the elliptical laser beams LB1 to LB3 constituting the multi laser beam MLB.

Therefore, if the surface of the measurement target object 14 irradiated with the laser beams LB1 to LB3 has a normal diffusing surface, an output of the CCD 17A provides a shape which is approximated by a power distribution shape of the laser beam, as illustrated. That is to say, the peak position at which the power of the laser beams LB1 to LB3 is at the maximum is at A0. Further, positions at which the laser beams LB1 to LB3 are weak (minimum) are at A4 and B4. Accordingly, the envelope of its quantity of light provides a shape similar to Gaussian distribution.

However, in reality, speckle noise occurs because phases of the reflection lights of the laser beams LB1 to LB3 are shifted from each other due to irregularity on the surface of the measurement target object 14.

As a result, the shape of the envelope of each of the laser beams LB1 to LB3 becomes different from the Gaussian distribution.

Therefore, according to the present embodiment, an irradiation center position of the laser beams LB1 to LB3 irradiating the surface of the measurement object target 14 is oscillated along a major axis direction of the elliptical shapes of the laser beams LB1 to LB3 on the surface of the measurement target object 14, by the optical system unit 16. Consequently, the influence of the speckle noise is cancelled (or reduced). Therefore, the envelope of the quantity of the received light of the laser beams LB1 to LB3 on the CCD 17A becomes close to the Gaussian distribution.

Figure 3:
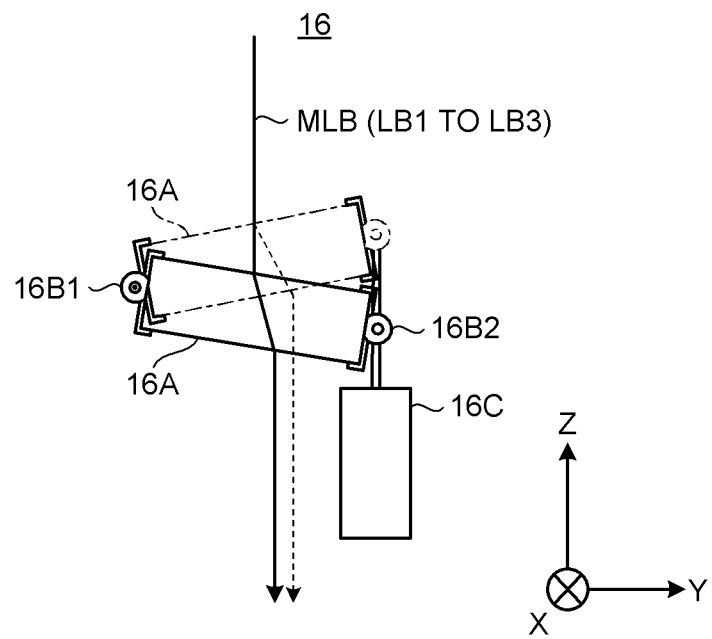
FIG. 3 is a diagram for explaining a general configuration of an optical system unit according to the first embodiment.

FIG. 3 is a diagram for explaining a schematic configuration of the optical system unit of the first embodiment.

The optical system unit 16 of the first embodiment comprises a glass flat plate A, rotation support members 16B1 and 16B2, and a linear actuator 16C. The laser beams LB1 and LB3 enter the glass flat plate A. The rotation support members 16B1 and 16B2 rotatably support one end of the glass flat plate 16A. The linear actuator 16C oscillates in the Z-axis direction, and rotates other end of the glass flat plate 16A about a rotating axis of the rotation support member 16B.

In the above configuration, the rotation support member 16B1 is fixedly arranged to a frame not illustrated. The rotation support member 16B2 is a free end.

Here, an operation of the optical system unit 16 is explained.

As illustrated in FIG. 3, when a distal end part of the linear actuator oscillates in the Z-axis direction, the glass flat plate 16A rotates. Accordingly, an angle of incidence of the laser beams LB1 to LB3 with respect to the glass flat plate 16A changes, thereby exit angles of each of the incident laser beams LB1 to LB3 oscillates in the Y-axis direction.

As a result, a position on the surface of the measurement target object 14 irradiated with the laser beams LB1 to LB3 oscillates in the y-axis direction. That is to say, the position oscillates along the major axis direction of the elliptical laser beams LB1 to LB3.

The speckle noise is generated when the laser beams LB1 to LB3 are fixed, and by the interference between the incident lights of each of the laser beams LB1 to LB3 and the reflection lights due to the irregularity on the surface of the measurement target object 14. However, as a result of the above, the generation of the speckle noise is suppressed.

As a result, the envelope of the quantity of received light of the laser beams LB1 to LB3 on the CCD 17A steadily approaches to the Gaussian distribution.

Therefore, it becomes capable of easily obtaining the minimum coordinate (coordinate of the darkest portion) within the well shape (dark portion) of the envelope of the quantity of the received light of the laser beams LB1 to LB3 constituting the multi-laser beam MLB. Therefore, the distance calculation in the distance calculating apparatus 19 can steadily be performed at higher accuracy.

[2] Second Embodiment

In the above first embodiment, the angle of incidence of the laser beams LB1 to LB3 entering the glass flat plate 16A in the optical system unit 16 is changed in oscillating manner. In contrast, according to a second embodiment, a reflection optical system is provided as an optical system unit. Consequently, the similar effect is obtained by changing the angle of reflection in oscillating manner.

Figure 4:
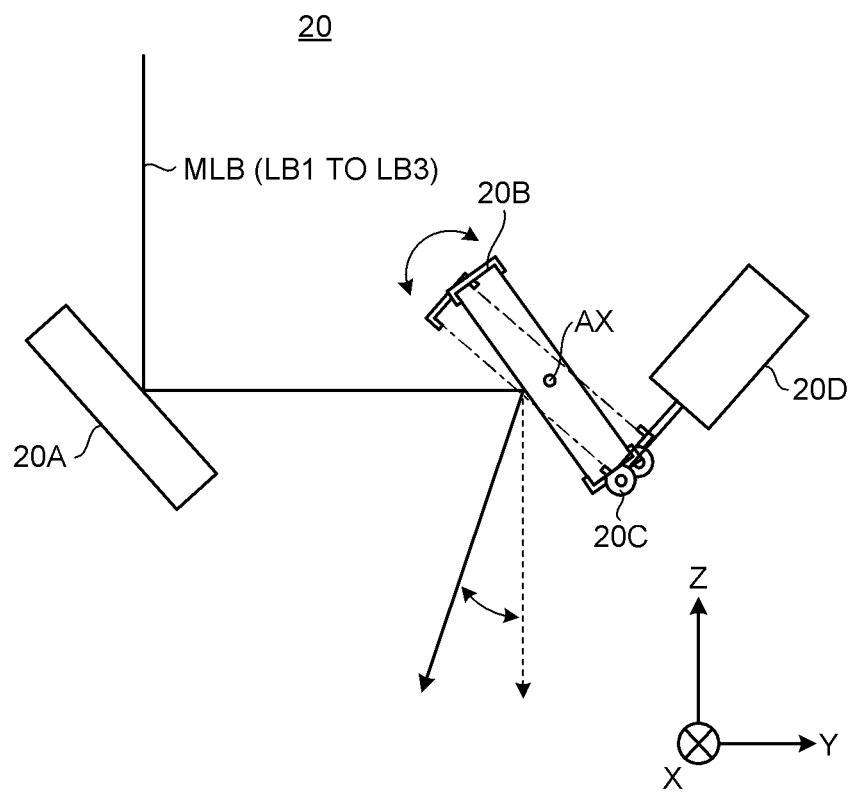
FIG. 4 is a diagram for explaining a general configuration of an optical system unit according to a second embodiment.

FIG. 4 is a diagram for explaining a schematic configuration of the optical system unit of the second embodiment.

The optical system unit 20 of the second embodiment is used to substitute the optical system unit 16 in FIG. 1.

The optical system unit 20 includes a first flat plate mirror 20A and a second flat mirror 20B. The first flat plate mirror 20A is fixedly arranged, and the laser beams LB1 to LB3 are incident on the first flat plate mirror 20A. The laser beams LB1 to LB3 reflected by the first flat plate mirror 20A are incident on the second flat plate mirror 20B. Then, the second flat plate mirror 20B reflects the laser beams LB1 to LB3, and guide the laser beams LB1 to LB3 to the surface of the measurement target object 14.

Further, the optical system unit 20 includes a rotation support member 20C and a linear actuator 20D. The rotation support member 20C rotatably supports the second flat plate mirror 20B about a rotating axis AX provided parallel to the X-axis (in a minor axis direction of the elliptical laser beams) as a rotating center. The linear actuator 20D oscillates the second flat plate mirror 20B at a position separated from the rotating axis AX of the second flat plate mirror 20B. The linear actuator 20D rotates the second flat plate mirror 20B about the rotating axis AX as a center.

Next, an operation of the optical system unit 20 is explained.

As illustrated in FIG. 4, when the distal end part of the linear actuator 20D reciprocates (oscillates), the second flat plate mirror 20B rotates about the rotating axis AX as a center, while changing the rotating direction.

According to the rotation of the second flat plate mirror 20B, the angle of incidence of the laser beams LB1 to LB3 with respect to the second flat plate mirror 20B is changed.

As a result, the reflection positions of each of the incident laser beams LB1 to LB3 reciprocate (oscillate) together in the Y-axis direction.

As a result, the position on the surface of the measurement target object 14 irradiated with the laser beams LB1 to LB3 reciprocates (oscillates) along the y-axis direction, i.e., along the major axis of the elliptical laser beams LB1 to LB3.

The speckle noise is generated when the laser beams LB1 to LB3 are fixed, and by the interference between the incident lights of each of the laser beams LB1 to LB3 and the reflection lights due to the irregularity on the surface of the measurement target object 14. However, as similar to the first embodiment, as a result of the above, the generation of such speckle noise is suppressed.

As a result, the envelope of the quantity of received light of the laser beams LB1 to LB3 on the CCD 17A steadily approaches to the Gaussian distribution.

Therefore, it becomes capable of easily obtaining the minimum coordinate (coordinate of the darkest portion) within the well shape (dark portion) of the envelope of the quantity of the received light of the laser beams LB1 to LB3 constituting the multi-laser beam MLB. Therefore, the distance calculation in the distance calculating apparatus 19 can steadily be performed at higher accuracy.

As described above, even by the second embodiment, the shape at the well portion (dark portion) of the distribution of the quantity of light of the multi laser beam can be approximated by a function (Gaussian distribution). Therefore, the minimum coordinate at which the quantity of light becomes at its minimum can accurately be obtained, thereby a distance can be calculated at high accuracy.

[3] Third Embodiment

In the above first and the second embodiments, in the optical system unit 16 or in the optical system unit 20, the angle of incidence of the laser beams LB1 to LB3 that are incident on the glass flat plate 16A or the second flat plate mirror 20B is changed in oscillating manner. In contrast, according to a third embodiment, an irradiating position is oscillated by changing a position of the flat plate mirror, which is a reflection member, along the optical axis, in order to obtain the similar effect.

Figure 5:
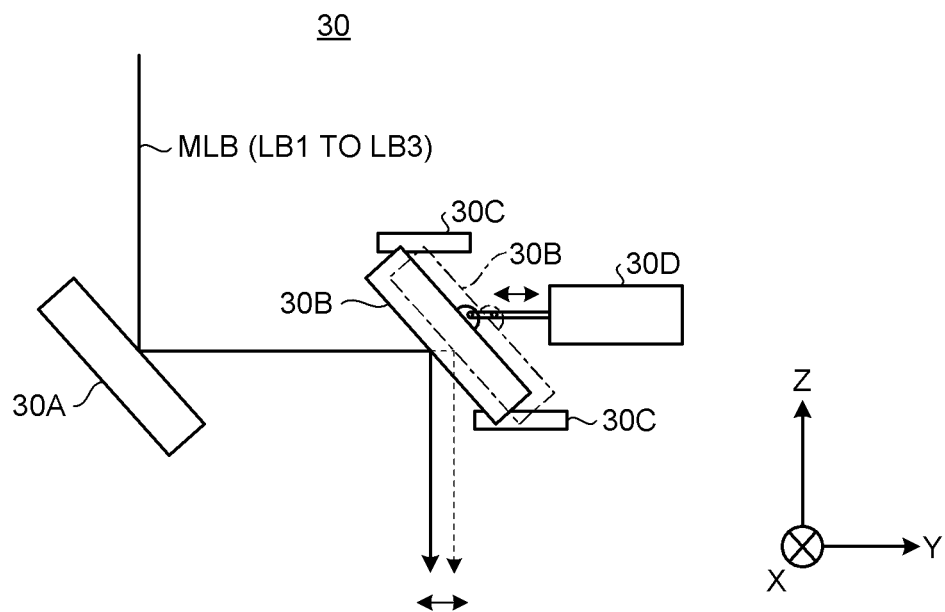
FIG. 5 is a diagram for explaining a general configuration of an optical system unit according to a third embodiment and FIG. 6 is a diagram for explaining a general configuration of an optical system unit according to the fourth embodiment.

FIG. 5 is a diagram for explaining a schematic configuration of an optical system unit of the third embodiment.

An optical system unit 30 of the third embodiment is used to substitute the optical system unit 16 of FIG. 1.

The optical system unit 30 includes a first flat plate mirror 30A and a second flat plate mirror 30B. The first flat plate mirror 30A is fixedly arranged. The laser beams LB1 to LB3 are incident on the first flat plate mirror 30A. The second flat plate mirror 30B is arranged parallel to the first flat plate mirror 30A. The laser beams LB1 to LB3 reflected by the first flat plate mirror 30A are incident on the second flat plate mirror 30B. Then, the second flat plate mirror 30B reflects the incident laser beams LB1 to LB3, and guide the reflected laser beams LB1 to LB3 to the surface of the measurement target object 14.

Further, the optical system unit 30 includes a slide support member 30C and a linear actuator 30D. The slide support member 30C slidably supports the second flat plate mirror 30B such that a distance between the first flat plate mirror 30A and the second flat plate mirror 30B can be changed. Here, the slide support member 30C slidably supports the second flat plate mirror 30B along a straight line parallel to the y-axis (major axis direction of the elliptical laser beams) while maintaining the parallel state with respect to the first flat plate mirror 30A. The linear actuator 30D oscillates the second flat plate mirror 30B along the y-axis direction, and slides the second flat plate mirror 30B.

Next, an operation of the optical system unit 30 is explained.

As illustrated in FIG. 5, when the distal end part of the linear actuator oscillates, the second flat plate mirror 20B changes a distance to the first flat plate mirror 30A along a straight line parallel to the y-axis while maintaining a parallel state with respect to the first flat plate mirror 30A, and slides. Then, the reflection position of the laser beams LB1 to LB3 is changed. Consequently, the positions at which the laser beams LB1 to LB3 are reflected oscillate in the y-axis direction.

As a result, the positions at which the laser beams LB1 to LB3 are incident on the surface of the measurement target object 14 reciprocate (oscillate) together in the Y axis direction, i.e., along the major axis direction of the elliptical laser beams LB1 to LB3.

The speckle noise is generated when the laser beams LB1 to LB3 are fixed, and by the interference between the incident lights of each of the laser beams LB1 to LB3 and the reflection lights due to the irregularity on the surface of the measurement target object 14. However, as similar to the first embodiment, as a result of the above, the generation of the speckle noise is suppressed.

As a result, the envelope of the quantity of received light of the laser beams LB1 to LB3 on the CCD 17A steadily approaches to the Gaussian distribution.

Therefore, it becomes capable of easily obtaining the minimum coordinate (coordinate of the darkest portion) within the well shape (dark portion) of the envelope of the quantity of the received light of the laser beams LB1 to LB3 constituting the multi-laser beam MLB. Therefore, the distance calculation in the distance calculating apparatus 19 can steadily be performed at higher accuracy.

As described above, even by the third embodiment, the shape at the well portion of the distribution of the quantity of light the multi laser beam can be approximated by a function (Gaussian distribution). Therefore, the minimum coordinate at which the quantity of light becomes at its minimum can accurately be obtained, thereby a distance can be calculated at high accuracy.

[4] Fourth Embodiment

Figure 6:
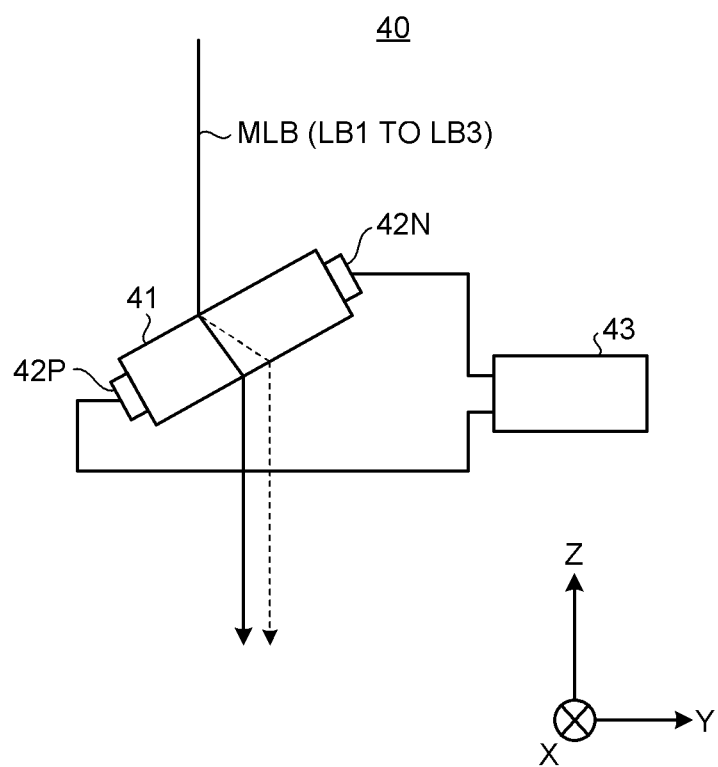

FIG. 6 is a diagram for explaining a schematic configuration of an optical system unit of a fourth embodiment.

An optical system unit 40 of a fourth embodiment is used to substitute the optical system unit 16 in FIG. 1.

In each of the above embodiments, a configuration with a movable portion is employed in order to reciprocate (change) the position on the surface of the measurement target object 14 irradiated with the multi laser beam. In contrast, the fourth embodiment is an embodiment in which the position is reciprocated (changed) electrically.

The optical system unit 40 broadly includes: an electro-optic effect element 41; electrodes 42P and 42N that apply voltage to the electro-optic effect element 41; and a voltage applying unit 43 that is capable of changing the voltage applied to the electro-optic effect element 41.

Here, an example of the electro-optic effect element 41 is PLZT (Lead-Lanthanum-Zirconium-Titanium), KTN crystal (transparent optical crystal formed of Potassium, Tantalum, Niobium, and Oxygen).

According to the above-configuration, the voltage applying unit 43 changes voltage (electric field strength) applied to the electro-optic effect element 41 via the electrodes 42P and 42N, thereby the index of refraction of the electro-optic effect element 41 is changed.

Consequently, as illustrated in FIG. 6, the position on the surface of the measurement target object 14 irradiated with the multi laser beam can be changed between the solid line and the dotted line. Thus, similar effect as that of the first embodiment can be obtained without providing a mechanical movable part.

[5] Modification of Embodiment

A control program executed in the distance measuring apparatus of the embodiments is recorded on a computer readable recording medium such as a CD-ROM, a flexible disk (FD), a CD-R, a DVD (Digital Versatile Disk), as a file of an installable or executable format, and provided.

Further, the control program executed in the distance measuring apparatus of the embodiments may be provided by being stored on a computer connected to the network such as the Internet and by being downloaded via the network. Further, the control program executed in the distance measuring apparatus of the embodiments may be configured so as to be provided or distributed via the network such as the Internet.

Further, the control program of the distance measuring apparatus of the embodiments may be configured such that the control program is preliminarily embedded in the ROM or the like and provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A distance measuring apparatus comprising:
   a multi laser beam emitting unit that irradiates a surface of a measurement target object with a plurality of elliptical laser beams provided in line in a minor axis direction;
   an image acquiring unit that receives reflected lights of the laser beams, and acquires an image of a bright and dark pattern of the reflected lights of the laser beams formed on an image acquiring face;
   an irradiating position changing unit that reciprocally moves irradiating positions of the laser beams all together along a major axis of the laser beams so that an envelope of quantity of the reflected lights of the laser beams formed on the image acquiring face becomes close to a Gaussian distribution; and
   a distance calculating unit that calculates a distance to the measurement target object based on the bright and dart dark pattern of the reflected lights on the image acquiring face.

2. The distance measuring apparatus of claim 1, wherein the irradiating position changing unit includes:
   a light transmissive flat plate member that is arranged on an optical path between the multi laser beam emitting unit and the measurement target object, the laser beams traveling through the light transmissive flat plate member;

a support member that swingably supports the light transmissive flat plate; and a driving unit that is driven so as to change an angle of incidence of the laser beams with respect to the light transmissive flat plate.

3. The distance measuring apparatus of claim 1, wherein the irradiating position changing unit includes:

a first flat plate reflection member that is fixed and arranged on an optical path between the light source and the measurement target object, and reflects the laser beams;

a second flat plate reflection member that reflects the laser beams reflected by the first reflective member so as to be led to the measurement target object side;

a support member that rotatably supports the second flat plate reflection member about a rotating axis parallel to a reflection face of the second flat plate reflective member; and a driving unit that rotates the second flat plate reflection member while changing a rotating direction.

4. The distance measuring apparatus of claim 1, wherein the irradiating position changing unit includes:

a first flat plate reflection member that is fixed and arranged on an optical path between the multi laser beam irradiating unit and the measurement target object, and reflects the laser beams;

a second flat plate reflection member that includes a reflection face arranged parallel to a reflection face of the first reflection member, and reflects the laser beams reflected by the first reflection member so as to be led to the measurement target object side; and a driving unit that reciprocally drives the second reflection member so that a distance between the first reflection member and the second reflection member changes.

5. A distance measuring method performed in a distance measuring apparatus including a multi laser beam emitting unit, an image acquiring unit, and a distance calculating unit, the multi laser beam emitting unit irradiating a surface of a measurement target object with a plurality of elliptical laser beams provided in line in a minor axis direction, the image acquiring unit receiving reflected lights of the laser beams and acquiring an image of a bright and dark pattern of the reflected lights of the laser beams formed on an image acquiring face, the distance calculating unit calculating a distance to the measurement target object based on the bright and dark pattern of the reflected lights on the image acquiring face, the method comprising:

causing the distance measuring apparatus to reciprocally move irradiating positions of the laser beams all together along a major axis of the laser beams so that an envelope of quantity of the reflected lights of the laser beams formed on the image acquiring face becomes close to a Gaussian distribution;

causing the distance measuring apparatus to acquire the image of the bright and dark pattern of the reflected lights of the laser beams; and causing the distance measuring apparatus to calculate the distance to the measurement target object based on the bright and dark pattern of the reflected lights.

6. A computer program product having a non-transitory computer readable medium including programmed instructions for controlling a distance measuring apparatus including a multi laser beam emitting unit, an image acquiring unit, and a distance calculating unit, the multi laser beam emitting unit irradiating a surface of a measurement target object with a plurality of elliptical laser beams provided in line in a minor axis direction, the image acquiring unit receiving reflected lights of the laser beams and acquiring an image of a bright and dark pattern of the reflected lights of the laser beams formed on an image acquiring face, the distance calculating unit calculating a distance to the measurement target object based on the bright and dark pattern of the reflected lights on the image acquiring face, wherein the instructions, when executed by a computer, cause the computer to perform:

reciprocally moving irradiating positions of the laser beams all together along a major axis of the laser beams so that an envelope of quantity of the reflected lights of the laser beams formed on the image acquiring face becomes close to a Gaussian distribution;

acquiring the image of the bright and dark pattern of the reflected lights of the laser beams; and calculating the distance to the measurement target object based on the bright and dark pattern of the reflected lights.

* * * * *